United States Patent [19]
Cobb, III et al.

[11] Patent Number: 5,140,394
[45] Date of Patent: Aug. 18, 1992

[54] ELECTROTHERMAL SENSOR APPARATUS

[75] Inventors: Carleton M. Cobb, III, East Walpole, Mass.; Stephen J. Strobel, Rumford; Norman E. Lecomte, Central Falls, both of R.I.; Sepideh H. Nott, Falls River, Mass.

[73] Assignee: Texas Instruments Incorporated, Dallas, Tex.

[21] Appl. No.: 343,696

[22] Filed: Apr. 24, 1989

Related U.S. Application Data

[62] Division of Ser. No. 224,153, Jul. 26, 1988, Pat. No. 4,866,559.

[51] Int. Cl.$^5$ .................... H01L 23/56; H01L 29/66
[52] U.S. Cl. ........................................ 357/28
[58] Field of Search .......................... 357/28

[56] References Cited

U.S. PATENT DOCUMENTS

| | | |
|---|---|---|
| 3,651,379 | 3/1972 | Moisand et al. . |
| 3,912,982 | 10/1975 | Fasulkey . |
| 3,987,311 | 10/1976 | Thornburg .................... 307/221 R |
| 4,001,649 | 1/1977 | Young . |
| 4,035,692 | 7/1977 | Luy et al. . |
| 4,104,692 | 8/1978 | Sudo et al. . |
| 4,232,212 | 11/1980 | Baraff et al. ........................ 219/216 |
| 4,547,826 | 10/1985 | Premerlani . |
| 4,553,092 | 11/1985 | Purves . |
| 4,571,608 | 2/1986 | Johnson ............................... 357/28 |
| 4,628,397 | 12/1986 | Gareis et al. . |
| 4,675,777 | 6/1987 | Watrous . |
| 4,683,515 | 7/1987 | Beihoff et al. ...................... 361/106 |
| 4,730,160 | 3/1988 | Cusack et al. .................. 324/158 R |
| 4,779,161 | 10/1988 | DeShazo, Jr. . |
| 4,792,877 | 12/1988 | Thornton . |

FOREIGN PATENT DOCUMENTS

1454323 11/1976 United Kingdom ............... 357/28

OTHER PUBLICATIONS

High Speed Thermal Transfer Printing, *IBM Tech. Disclosure*, vol. 28, #7, Dec. 1985.

Primary Examiner—Andrew J. James
Assistant Examiner—Stephen D. Meier
Attorney, Agent, or Firm—Russell E. Baumann; Richard L. Donaldson; René E. Grossman

[57] ABSTRACT

A protective circuit capable of remotely switching power to a load on and off and including an electrothermal sensor system having a heating element of predetermined resistance in series with the load and source of power whereby the temperature of the heating element is monitored relative to ambient temperature to determine current flow in the heater. The electrothermal sensor, according to one embodiment, includes a ceramic substrate having the heater formed thereon with a first deposited heat monitoring element thereon for monitoring the temperature of the heater and a second heat monitoring element thereon for monitoring the ambient temperature of the substrate remote from the heater. The electrothermal sensor, according to a second embodiment, includes a layer of electrically conductive material, a backing layer thereon of electrically insulating material, a grid on the backing layer of thermoresponsive material to form RTDs and a second layer of electrically insulating material over said grid.

1 Claim, 4 Drawing Sheets

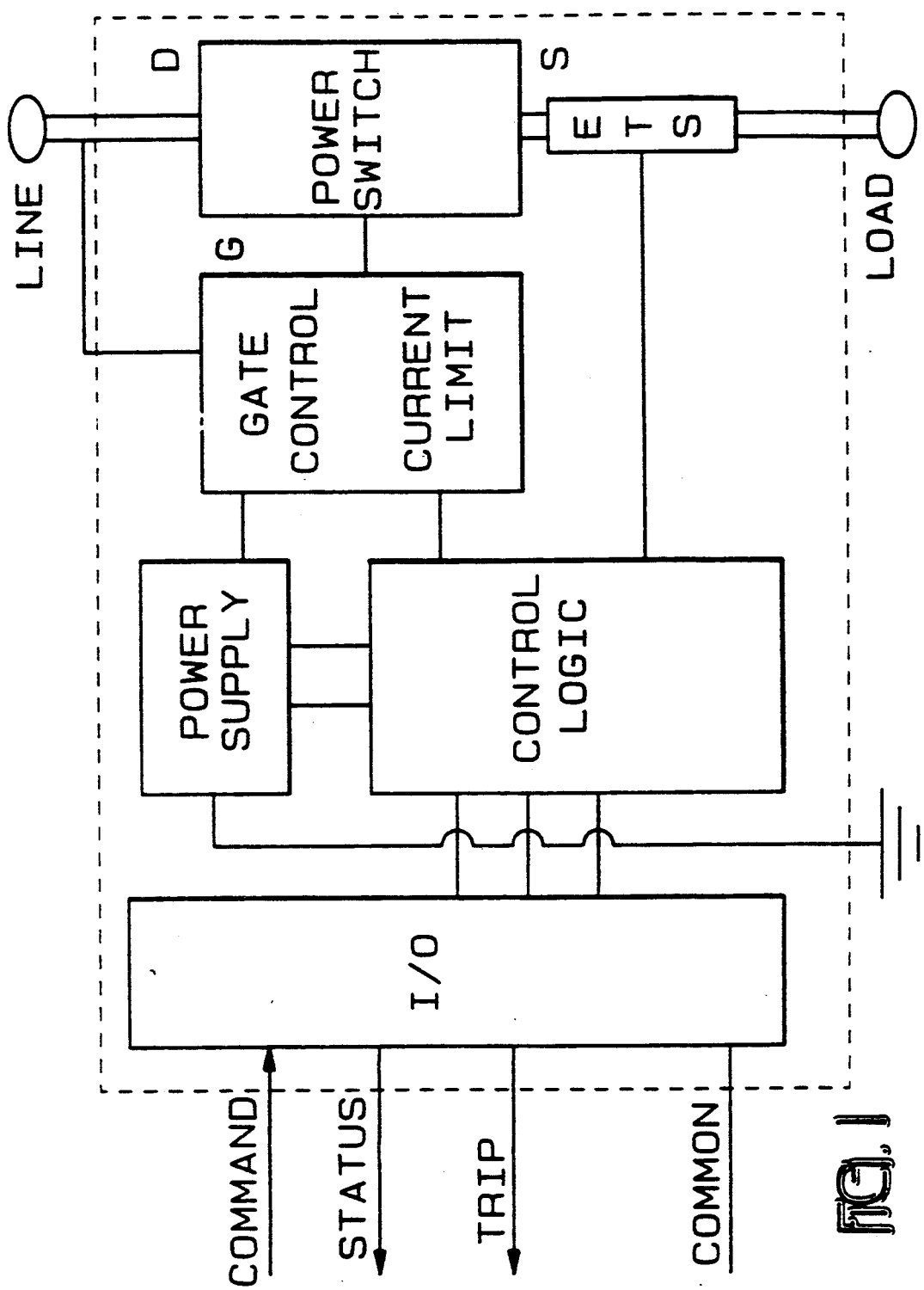

ELECTROTHERMAL SENSOR APPARATUS

This application is a division of application Ser. No. 07/224,153, filed Jul. 26, 1988, now U.S. Pat. No. 4,866,559.

BACKGROUND OF THE INVENTION

1. Field of the Invention

This invention relates to a solid state circuit protector and, more specifically, to a solid state circuit for determining circuit malfunctions and the electrothermal sensor used in conjunction therewith.

2. Brief Description of the Prior Art

Circuit protection, especially as applied to high current environments, is generally embodied in electro/magnetic/thermal/mechanical circuit breakers (EMM CB). The current-time-trip relationship is determined by internal mechanisms which may be thermal, magnetic, mechanical, etc.

These circuit breakers connect an electrical load to the power source and are typically manually set. The current-time-trip relationship is determined by internal mechanisms which may be thermal, magnetic, mechanical, etc. Such circuit breakers are usually located in a panel which is easily accessible for monitoring and manual switching.

In thermal circuit breakers and other devices, the bimetal thermal analog operates against a mechanical latch. Such devices are typified by, for example, a bimetal element heated by the current flowing through the wire or cable, the bimetal being the thermal analog of the wire. This requires the bimetal to work against the latch, making its timing function more complicated and subject to variation. It is also readily apparent that such prior art circuit protection devices cannot be easily operated from locations remote therefrom.

SUMMARY OF THE INVENTION

In accordance with the present invention, the above noted problems of the prior art are minimized.

Briefly, in accordance with the present invention, there is provided a circuit protection system which includes an input/output circuit (I/O) which interfaces with an input system, such as for example, some form of flight control system, such as a computer, switches on a flight deck, etc., the input system being controlled in some manner and sending output signals. A power supply is connected to the power line and provides controlled power to the control logic and other circuitry forming the protection system. A gate control which is powered by the power supply and controlled by the control logic operates a solid state power switch between the line power and the load. The line is coupled to the load via an electrothermal sensor (ETS) or transducer system.

The ETS system includes an electrothermal sensor element positioned over or closely adjacent to a resistive element in series with the power line to the load to monitor the current to the load and provides a signal to the control logic indicative of the sensed current thereat. The current value is determined from the amount of heating caused by the current flow through or in the line coupled to the ETS, the amount of heat being determined by the ETS.

When it is desired to supply power to the load from the line, a command signal is provided to the I/O which, in turn directs the logic in the control logic to operate the gate control and thereby close the power switch. The power switch can also be opened by providing an appropriate command signal when the power switch is closed in the same manner as discussed above for switch closing.

When the power switch is closed to provide current to the load and, subsequently, a current of greater than a predetermined value is sensed due to heating of the ETS, the ETS provides a voltage indication thereof to the control logic which, in turn, provides a signal to the gate control to turn off the power switch after a predetermined period of overload has been sensed. The time period required to turn off, or trip, the power switch can be controlled in accordance with a time-current curve, as is well known, so that the waiting period is decreased according to a predetermined function as the amount of overload increases. The system can optionally permit the power switch to be reclosed when the signal provided by the ETS indicates a permissible temperature thereat.

The ETS comprises a resistive element of a predetermined resistance to aid in controlling maximum current flow to the load under, for example, short circuit conditions. A first temperature sensor or transducer is disposed on the element at a central region thereof to measure the element temperature and a second sensor or transducer is disposed adjacent the element and in close proximity to the element environment to measure the ambient temperature. In this manner, the temperature differential between ambient and the element can be readily determined. This temperature differential is determined by providing a signal indicative of measured temperature from each sensor to a comparator which provides an output voltage indicative thereof. The difference signal is utilized by the control logic to determine when an alarm condition is present.

An instant trip circuit is provided using the resistive element and sensor as described hereinabove. The resistive element, which has a predetermined resistance, has a temperature sensor thereon, the temperature sensor providing an indication of the element temperature to a comparator. The other input to the comparator is a signal indicative of ambient temperature as discussed hereinabove whereby the comparator provides the difference signal. In addition, the voltage across the resistive element, which increases with increase in line current, is provided at an instant trip comparator. The instant trip comparator compares this voltage with a reference voltage to provide the trip signal when the output therefrom reaches some predetermined value to cause opening of the power switch via the logic without delay.

The ETS per se can take many forms. A preferred form includes a ceramic substrate, preferably of steatite, having the conductive element formed thereon. Current through the conductive element causes heating of the substrate. Thick film thermistors are also formed on the substrate, one immediately next to or over the conductive element and one at a predetermined distance form the conductive element to provide a substantially ambient temperature reading. The temperature difference between the two thermistor locations results in different resistances of the thermistors which provides a indication of the current in the conductor in the manner discussed hereinabove. Proper sizing of the substrate and the conductor and proper location of the thermistors permits a variety of current/time/temperature characteristics to be realized. This ETS embodiment provides the advantages that the thermal expansion of the ceramic and other parts is matched to minimize errors due to such thermal expansion. Also, thick film processing is adapted to low cost, high volume production. Conductors and thermistors fired onto alumina are very reliable and repeatable, thereby improving product reliability and reducing calibration costs. The thermistors can be laser trimmed, eliminating the need for separate trimming resistors. Also, since the two thermistors are processed together, the temperature coefficients thereof will have a good match.

A further ETS embodiment is formed by providing a shunt metal layer (heater) of an electrically conductive metal, preferably manganin, a copper-nickel-manganese alloy. A backing layer of electrically insulating material, preferably Kapton, a polyimide, is deposited over the shunt metal layer. A grid pattern of a material displaying a substantially linear temperature coefficient of resistance, preferably nickel, is then deposited over the backing layer to form resistive temperature devices (RTDs). A second electrically insulating layer, preferably of Kapton is then formed over the grid. In this embodiment, line current passes between shunt terminals along the shunt layer and provides heat in proportion to the current passing therethrough. This heat is sensed by the RTDs which are spaced over the shunt and provide a signal indicative of the current passing through the shunt in the same manner as discussed hereinabove.

BRIEF DESCRIPTION OF THE DRAWINGS

FIG. 1 is a block diagram of a solid state circuit protector system in accordance with the present invention;

DESCRIPTION OF THE PREFERRED EMBODIMENT

Referring first to FIG. 1, there is shown a block diagram of a circuit protection system in accordance with the present invention. The system includes in input/output circuit (I/O) which interfaces with an input system, such as for example, some form of flight control system, such as a computer, switches on a flight deck, etc., the input system being controlled in some manner and sending out signals. The inputs to the I/O are shown as Command and common, the latter being a system reference and not necessarily earth ground. In addition, inputs are provided to the I/O from the control logic. Outputs from the I/O are shown as Status and Trip. In addition, an output from the I/O is provided to the control logic. All three I/O lines are electrically isolated from the remainder of the system electronics, preferably by the use of opto-isolators, such as TIL118, manufactured by Texas Instruments Incorporated. The input command signal is brought high to turn the system on and brought low to turn the system off. Both the status and the trip lines are open collector outputs. A high impedance on the status line indicates the system is on whereas a low level thereon indicates the system is off. A high impedance on the trip line indicates the system is off due to an overcurrent trip. High impedance on both lines indicates a built-in-test failure.

A power supply is connected to the power line and provides controlled power to the control logic and other circuitry forming the protection system. A gate control which is powered by the power supply and controlled by the control logic operates a power switch between the line power and the load. The power switch is a power MOSFET having its drain coupled to the line and its source coupled to the load via the ETS. The gate of the MOSFET is coupled to the gate control circuit for control of MOSFET operation.

The control logic takes the command signal from the I/O module and the time-current and MOSFET protection trip signals from their respective modules and open or close the power switch accordingly. The control logic also sets the status and trip lines to the appropriate logic levels and indicates a built-in-test failure when detected by the bit module. In addition, the control logic provides a power-up-delay to insure that all system modules are powered before the power switch can be turned on. As explained hereinbelow, an electrothermal sensor (ETS) is disposed over a resistive element in series with and forming a part of the power line to the load to monitor the current to the load and provide a signal to the control logic indicative of the sensed current thereat. The current value is determined from the amount of heating caused by the current flow through the resistive element in the line coupled to the ETS, the amount of heat being determined by the ETS.

Figure 7:
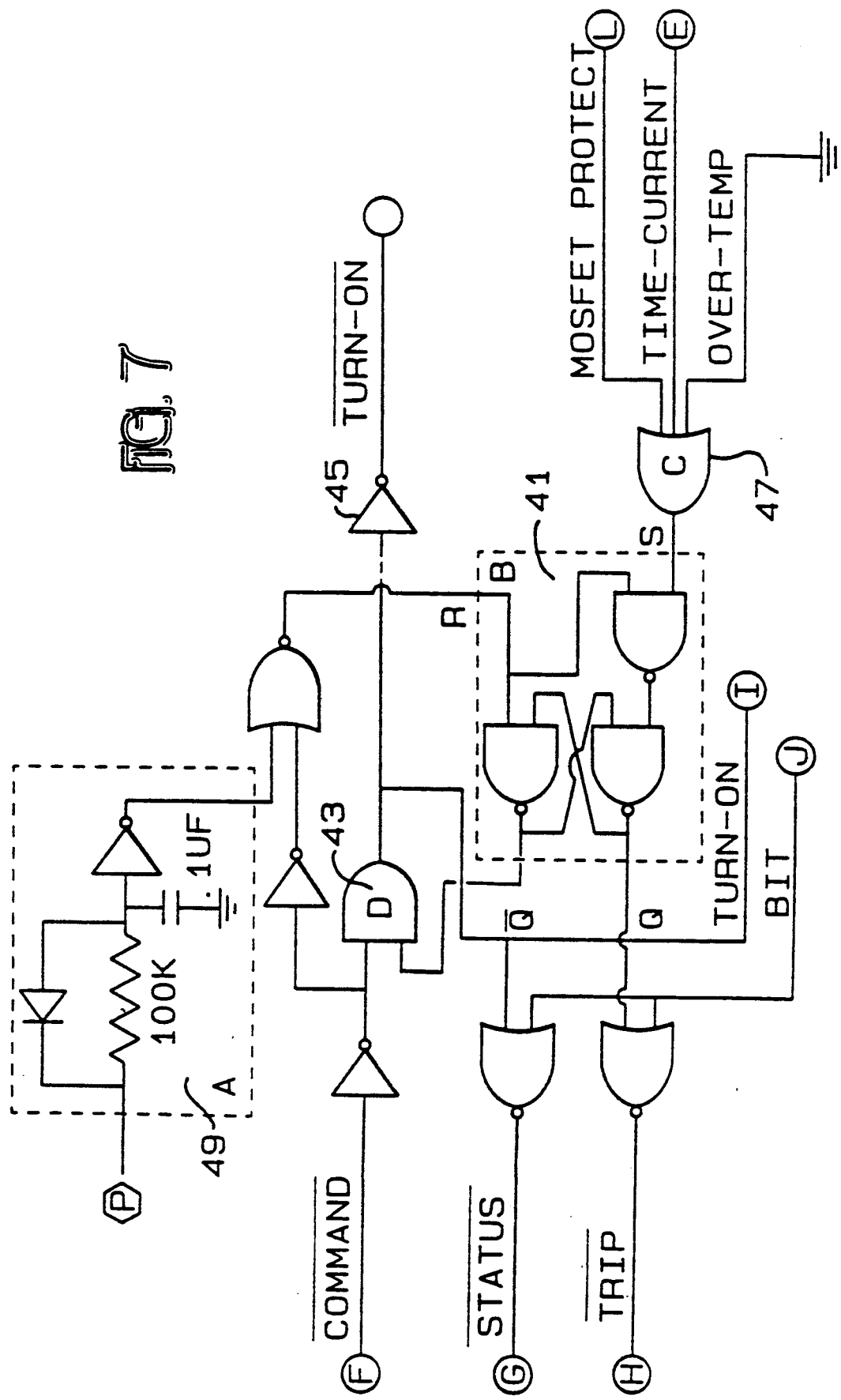
FIG. 7 is a circuit diagram of typical control logic for use in accordance with the present invention.

Referring now to FIG. 7, there is shown a typical control logic circuit which can be used in accordance with the present invention. The circuit includes the command input and status and trip outputs. A latch circuit 41 of standard design is controlled by external signals shown as "MOSFET protect", "time-current" and "over-temp" via an OR circuit 47 to control the "trip" output and the "command" input. The command input, via AND gate 43 and inverter 45, controls turn on of the system. The latch circuit 41 is also under control of a delay circuit 49 which introduces a 10 msec. delay before operation of the trip or turn on circuits.

When the system is turned on, the command input goes low and the latch circuit 41 is reset, causing gate 43 to go high and the turn on output via inverter 45 to go low. This action closes the power switch (FIG. 1) and the status output goes low. If any one of the three inputs to gate 47 goes high, the latch 41 is set, causing gate 43 to go low and opening the power switch. This sends the trip output low and the status output high. When the command line goes low, latch 41 is reset and the trip output goes high. The system is not ready to be turned back on. If the system is just turned off by taking the command line low, the latch 41 remains reset but the command input goes high, causing gate 43 to go low and opening the MOSFET power switch. Circuit 49 is a 10 msec. time delay for power-up and prevents the MOSFET switch from being closed until 10 msec. after the line power is applied, even if the command line is high at the time of powerup.

When it is desired to supply power to the load from the line, the command signal is provided to the I/O which, in turn controls the logic in the control logic to operate the gate control and thereby close the power switch. The power switch can also be opened by providing an appropriate command signal when the power switch is closed in the same manner as discussed above for switch closing.

Figure 2:
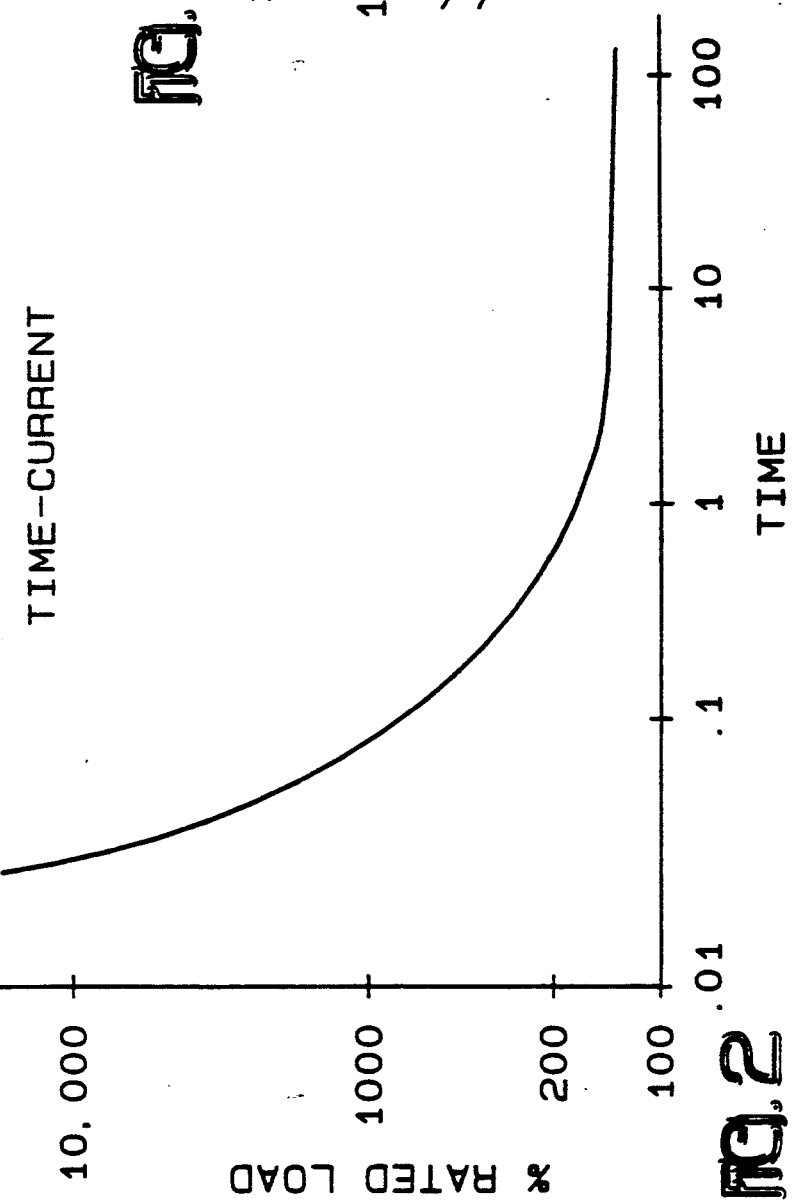
FIG. 2 is a time-current curve as used in accordance with the present invention.

When the power switch is closed to provide current to the load and, subsequently, a current of greater than a predetermined value is sensed due to heating of the ETS, the ETS provides a voltage indication thereof due to a change in resistance to the control logic which, in turn, provides a signal to the gate control to turn off the power switch after a predetermined period of overload has been sensed. The time period required for turn off of the power switch is controlled in accordance with a time-current curve as shown in FIG. 2, as is well known, so that the waiting period is decreased according to a predetermined function as the amount of overload increases. The status of the system can be provided remotely by placing such status on the status output from the I/O. Also, when the power switch is being opened due to sensing of a temperature in the alarm range, a signal is provided by the control logic on the trip output therefrom to indicate that power has been cut off at a remote location. The system can be designed to permit the power switch to be reclosed when the signal provided by the ETS indicates a current to the load is the permissible (less than the predetermined) range.

Figure 3:
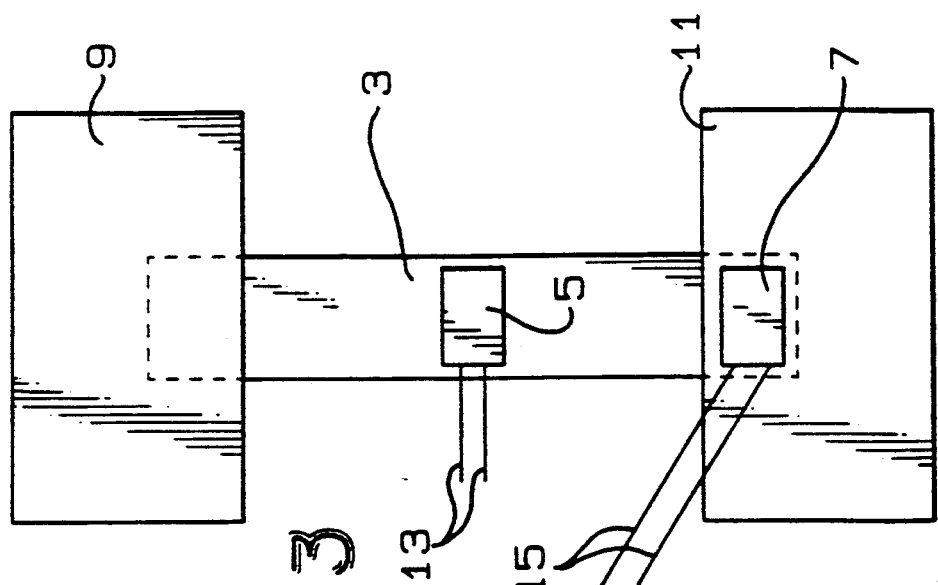
FIG. 3 is a schematic diagram of an electrothermal system in accordance with the present invention.

The ETS 1 comprises a resistive element 3 of predetermined resistance as shown in FIG. 3. A first temperature sensor or transducer 5 is disposed on the element at the central region thereof to measure the element temperature and a second sensor or transducer 7 is disposed adjacent the element and in close proximity thereto to measure the ambient temperature. The element 3 is shown mounted on heat sink studs 9 and 11 at which locations the element 3 is coupled to the line and the load. In this manner, the temperature differential between ambient and the element can be determined. The temperature differential is determined by providing a signal indicative of measured temperature from each sensor along the lines 13 and 15 to a comparator (not shown) which provides an output voltage indicative thereof. The difference signal is utilized by the control logic to determine when an alarm condition is present as shown in FIG. 1. The comparator can be a part of the control logic.

Figure 4:
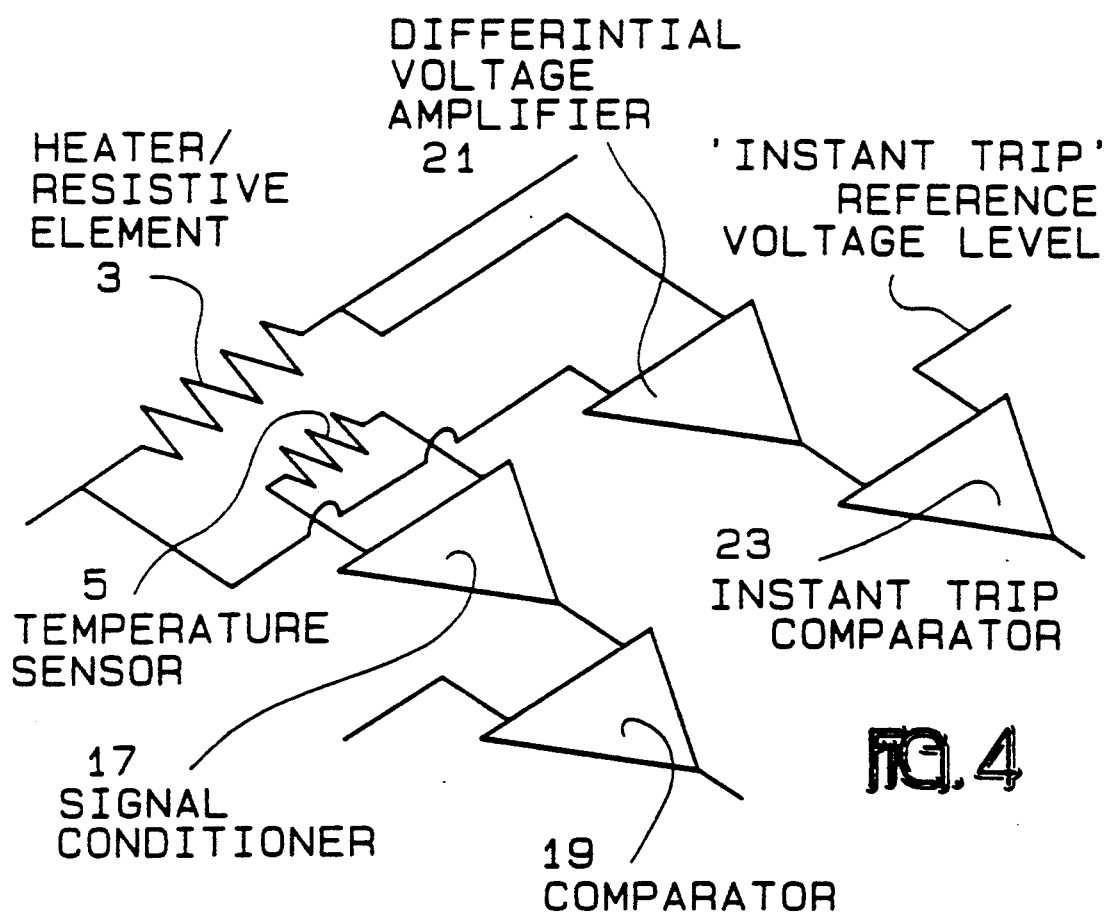
FIG. 4 is a circuit diagram of trip circuit in accordance with the present invention.

With reference to FIG. 4, there is shown a modification of the control logic comprising an instant trip circuit which is provided using the resistive element 3 and sensor 5 as described hereinabove. As can be seen, the resistive element 3, which has a predetermined resistance, has a temperature sensor 5 thereon, the temperature sensor providing an indication of the element temperature via a signal conditioner 17, the signal conditioner then providing one of the two inputs to the comparator 19. The other input to the comparator 19 is a signal indicative of ambient temperature as discussed hereinabove which would be provided, for example, from the sensor 7 via lines 15 and intermediate signal conditioner (not shown). In addition, the voltage across the resistive element 3 is sensed, this voltage being a function of line current. This voltage is sensed by a differential voltage amplifier 21 which provides an output indicative of said voltage to an instant trip comparator 23. The instant trip comparator 23 compares the output from the comparator 21 with a reference signal to provide the trip signal which may be coupled to the gate control to turn off the power switch when the output therefrom reaches some predetermined value.

Figure 5:
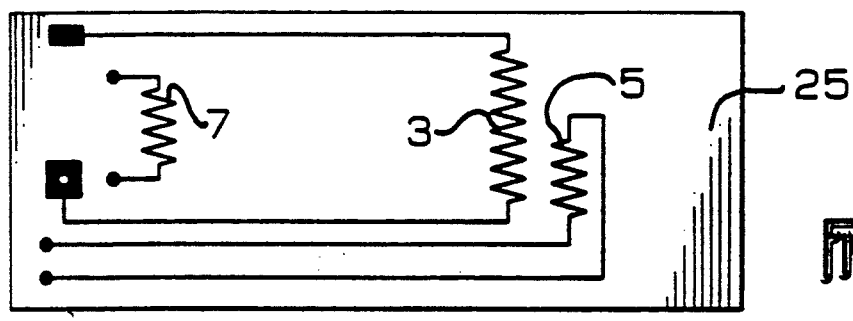
FIG. 5 is a diagram of an electrothermal sensor in accordance with a first embodiment of the present invention.

The ETS per se can take many forms. A preferred form, as shown in FIG. 5, includes a steatite substrate 25 having the conductive wire formed thereon of palladium/silver by silk screening. Current through the conductive wire 3 causes heating of the substrate 25. Thick film thermistors 5 and 7 are also formed on the substrate by silk screening of nickel, though other materials (PTC/NTC) are acceptable, thermistor 5 immediately next to the conductive wire 3 and thermistor 7 at a predetermined distance from the conductive wire. The temperature difference between the two thermistor locations results in different resistances of the thermistors 5 and 7 which provides an indication of the current in the conductor in the manner discussed hereinabove. Proper sizing of the substrate 25 and the conductive wire 3 and proper location of the thermistors 5 and 7 permits a variety of current/time/temperature characteristics to be utilized.

Figure 6:
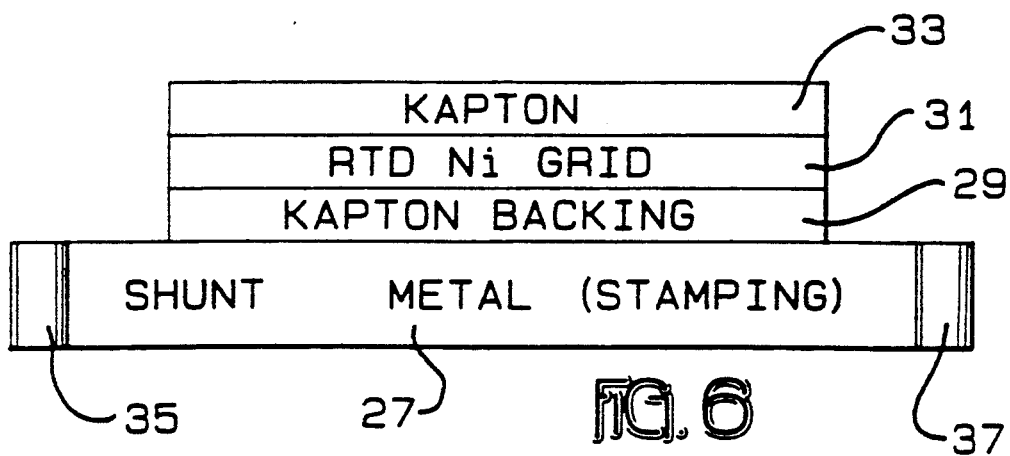
FIG. 6 is a diagram of an electrothermal sensor in accordance with a second embodiment of the present invention.

A further ETS embodiment, as shown in FIG. 6, is formed by providing a shunt metal (stamping) 27 preferably of electrically conductive manganin, a copper-nickel-manganese alloy. A separator layer of electrically insulating material 29, preferably Kapton, a polyimide, is deposited over the shunt metal layer 27. A grid pattern 31, preferably of nickel, which displays a substantially linear temperature coefficient of resistance, is then deposited over the separator layer 29 to form resistive temperature devices (RTDs). A second electrically insulating layer 33, preferably of Kapton, is then deposited over the grid layer 31.

In the embodiment of FIG. 6, line current passes between the shunt terminals 35 and 37 and along the shunt layer 27 to provide heat in proportion to the current passing therethrough. This heat is sensed by the RTDs 31 which are spaced over the shunt 27 and provide a signal indicative of the current passing through the shunt in the same manner as discussed hereinabove.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. An electrothermal sensor comprising:
    a resistive element of predetermined electrical resistance;
    a first electrothermal sensor disposed on a central region of said element for monitoring the temperature of said element as an indication of the current level passing through said element;
    a second electrothermal sensor disposed adjacent said element and remote from said central region to monitor the ambient temperature of said element; and
    heat sink means upon which said resistive element is mounted, said heat sink means having spaced studs between which the resistive element is coupled.

* * * * *